(12) United States Patent
Chou et al.

(10) Patent No.: US 9,695,347 B2
(45) Date of Patent: Jul. 4, 2017

(54) SLURRY COMPOSITION FOR CHEMICAL MECHANICAL POLISHING OF METAL AND POLISHING METHOD USING THE SAME

(75) Inventors: Homer Chou, Seongnam-si (KR); Won Lae Kim, Seoul (KR); Jong Il Noh, Daegu Gwangyeok-si (KR); In Kyung Lee, Euiwang-si (KR); Tae Young Lee, Gunpo-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 607 days.

(21) Appl. No.: 11/965,453

(22) Filed: Dec. 27, 2007

(65) Prior Publication Data
US 2009/0095939 A1    Apr. 16, 2009

(30) Foreign Application Priority Data
Oct. 10, 2007    (KR) .................... 10-2007-0102316

(51) Int. Cl.
| | | |
|---|---|---|
| *H01L 21/302* | (2006.01) | |
| *H01L 21/461* | (2006.01) | |
| *C09K 3/14* | (2006.01) | |
| *C09G 1/02* | (2006.01) | |
| *C23F 3/06* | (2006.01) | |
| *H01L 21/321* | (2006.01) | |

(52) U.S. Cl.
CPC .............. *C09K 3/1463* (2013.01); *C09G 1/02* (2013.01); *C09K 3/1409* (2013.01); *C23F 3/06* (2013.01); *H01L 21/3212* (2013.01)

(58) Field of Classification Search
USPC .......................................... 438/693; 216/89
See application file for complete search history.

(56) References Cited

U.S. PATENT DOCUMENTS

| | | | |
|---|---|---|---|
| 6,117,775 | A | 9/2000 | Kondo et al. |
| 6,454,819 | B1 | 9/2002 | Yano et al. |
| 6,461,230 | B1 | 10/2002 | Tsai et al. |
| 6,565,767 | B2 | 5/2003 | Hattori et al. |
| 6,632,259 | B2 | 10/2003 | Weinstein et al. |
| 6,679,928 | B2 | 1/2004 | Costas et al. |
| 6,776,810 | B1 | 8/2004 | Cherian et al. |

(Continued)

FOREIGN PATENT DOCUMENTS

| | | |
|---|---|---|
| JP | 2004-204118 | 7/2004 |
| JP | 2004-533115 | 10/2004 |

(Continued)

OTHER PUBLICATIONS

F.W. Preston, The Theory and Design of Plate Glass Polishing Machines, J. Soc. Glass Tech., vol. 11, 214-256, (1927).

(Continued)

*Primary Examiner* — Roberts Culbert
(74) *Attorney, Agent, or Firm* — Additon, Higgins & Pendleton, P.A.

(57) ABSTRACT

Provided is a slurry composition for chemical mechanical polishing (CMP) of a metal. The slurry composition comprises a copolymer whose average molecular weight is from about 600,000 to about 1,300,000 and whose monomers are acrylic acid and acrylamide in a molar ratio of about 1:30 to about 30:1. The slurry composition exhibits a non-Prestonian behavior to achieve minimized dishing and attain a high degree of planarization.

45 Claims, 1 Drawing Sheet

(56) References Cited

U.S. PATENT DOCUMENTS

| | | |
|---|---|---|
| 6,821,897 B2 | 11/2004 | Schroeder et al. |
| 6,896,825 B1 | 5/2005 | Uchida et al. |
| 6,899,821 B2 | 5/2005 | Uchida et al. |
| 8,157,877 B2 | 4/2012 | Ikeda et al. |
| 8,460,414 B2 | 6/2013 | Etoh et al. |
| 2002/0155702 A1* | 10/2002 | Aoki et al. ............ 438/653 |
| 2002/0173241 A1* | 11/2002 | Costas et al. ............ 451/41 |
| 2002/0173243 A1 | 11/2002 | Costas et al. |
| 2003/0168627 A1 | 9/2003 | Singh et al. |
| 2003/0228763 A1* | 12/2003 | Schroeder et al. ........ 438/691 |
| 2005/0095860 A1 | 5/2005 | Uchida et al. |
| 2005/0189322 A1 | 9/2005 | Lane et al. |
| 2006/0000150 A1 | 1/2006 | Kelley et al. |
| 2006/0000151 A1 | 1/2006 | Kelley et al. |
| 2006/0138086 A1 | 6/2006 | Lane et al. |
| 2006/0191872 A1 | 8/2006 | Webb et al. |
| 2006/0205219 A1 | 9/2006 | Baker et al. |
| 2007/0007248 A1 | 1/2007 | Lane et al. |
| 2007/0176141 A1 | 8/2007 | Lane et al. |
| 2008/0029126 A1 | 2/2008 | Thomas |

FOREIGN PATENT DOCUMENTS

| | | |
|---|---|---|
| JP | 2006-326760 | 12/2006 |
| JP | 2007-19531 | 1/2007 |
| KR | 10-2004-0002907 A | 1/2004 |
| KR | 10-2007-0035513 A | 3/2007 |
| WO | 2006/112377 | 10/2006 |
| WO | 2007/069488 A1 | 6/2007 |
| WO | 2009048203 A1 | 4/2009 |

OTHER PUBLICATIONS

K. W. Chen et al., Novel slurry solution for dishing elimination in copper process beyond 0.1 μm technology, Thin Solid Films 498, 50-55 (2006).

S. Kondo et al., Abrasive-Free Polishing for Copper Damascene Interconnection, Journal of the Electrochemical Society, 147 (10) 3907-3913 (2000).

Korean Office Action in counterpart Korean Application No. 10-2007-0102316, dated Mar. 2, 2010.

International Search Report in counterpart International Application No. PCT/KR2008/000377, dated Jul. 9, 2008.

Taiwanese Office Action in counterpart Taiwanese Application No. 97106111, dated Oct. 4, 2011, pp. 1-9.

European Search Report in counterpart European Application No. 08704900.3 dated Nov. 16, 2012, pp. 1-7.

Office Action in counterpart Japanese Application No. 2010-528781 dated Sep. 3, 2013, pp. 1-6.

\* cited by examiner

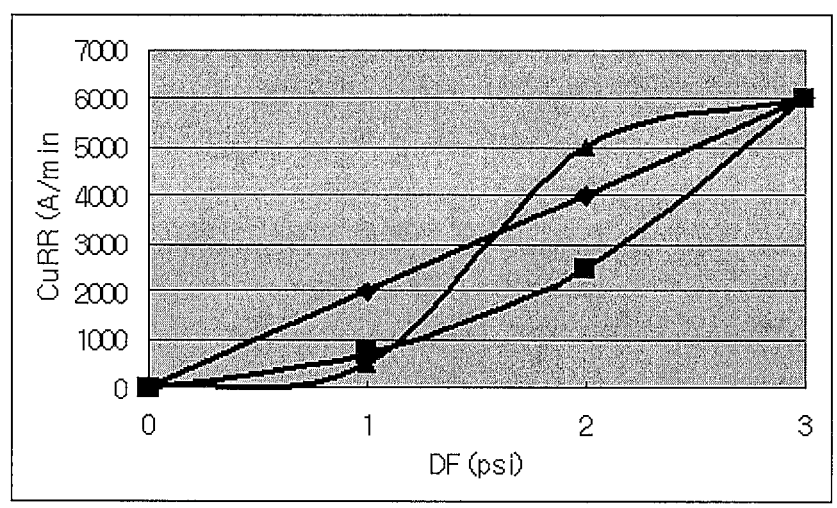

SLURRY COMPOSITION FOR CHEMICAL MECHANICAL POLISHING OF METAL AND POLISHING METHOD USING THE SAME

CROSS-REFERENCE TO RELATED APPLICATION

This non-provisional application claims priority under 35 USC Section 119 from Korean Patent Application No. 10-2007-0102316, filed on Oct. 10, 2007, which is hereby incorporated by reference in its entirety.

FIELD OF THE INVENTION

The present invention relates to a composition for use in the manufacture of an integrated circuit device and a method for the manufacture of an integrated circuit device using the composition. More specifically, the present invention relates to a method and a composition for the planarization of a metal layer on an integrated circuit substrate by chemical mechanical polishing (CMP).

BACKGROUND OF THE INVENTION

Typically, transistors of a semiconductor chip used in an electronic device are connected to one another through a pattern of interconnect trenches formed within a dielectric layer. The pattern arrangements usually have a damascene or dual damascene structure. A barrier layer covers the patterned dielectric layer and a metal layer covers the barrier layer. The metal layer has at least sufficient thickness to fill the patterned trenches with metal to form circuit interconnects.

Interconnect trenches must have sufficiently high density and degree of complexity to manufacture a device comprising transistors whose intervals are 0.25 μm or less. Thus, chemical mechanical polishing (CMP) is required for effective and efficient use of the transistors. Typical metal interconnect CMP necessitates multiple polishing steps. For example, the first step is carried out to essentially remove excess metal interconnects, such as copper interconnects, at an initial high rate (>5,000 Å/min.), and then the second step is carried out to remove a portion of the metal that remains on a barrier layer outside of the metal interconnects and maximize the surface planarity of the metal interconnects using a finely divided abrasive. Subsequent polishing removes the barrier from an underlying dielectric layer to provide a planar polished surface on the metal interconnects embedded in a damascene or dual damascene structure and the dielectric layer.

The metal within the trenches functions as a metal line forming an interconnect circuit. Metal CMP tends to remove not only metal present outside of a pattern of trenches filled with an interconnect metal but also the interconnect metal present within the trenches. The removal of the metal from the trenches causes a so-called "dishing" phenomenon. Dishing is an unfavorable phenomenon because it causes variations in the critical dimensions of the metal circuit. Serious dishing can generally occur when the metal removal rate is high. Treatment of the metal with a polishing slurry that exhibits a non-Prestonian behavior is considered a method for minimizing dishing and attaining a high degree of planarization.

Earlier copper CMP slurries exhibit linear Prestonian behavior (F. W. Preston. *J. Soc. Glass Tech.* 11, 214 (1927)). For example, the removal rate of copper is a first-order function of pressure applied to a substrate and polishing rate. This example is indicated by line ♦ in the graph of FIG. 1 (Chen et al. *Thin Solid Films* 498, 50-55, 2006). Some literature and patent publications disclose that when copper polishing slurries exhibit a non-Prestonian behavior indicated by line ■ or ▲ in FIG. 1 during copper CMP, high planarization efficiency and low pattern dependency can be accomplished ((a) U.S. Pat. Pub. No. 2006/0000151; (b) U.S. Pat. No. 6,454,819 (2002) to H. Yano, G. et al.; (c) U.S. Pat. No. 6,565,767 (2003) to M. Hattor et al, (d) U.S. Pat. No. 6,821,897 (2004) to D. J. Schroeder et al.; (e) S. Kondo et al. *J. Electrochem Soc.* 147, 3907 (2000)). That is, the non-Prestonian behavior is observed when the removal rate of copper shows a linear correlation with respect to pressure or polishing rate. Regions with a high topography in a wafer are exposed to relatively high local pressures and are thus removed at high rates. However, the CMP systems (e.g., slurries) exhibiting a non-Prestonian behavior shown in FIG. 1 polish high-topography regions at much lower rates than slurries exhibiting a Prestonian behavior. In conclusion, slurries exhibiting a non-Prestonian behavior can widen over-polishing window of copper CMP to planarize copper in a more efficient and rapid manner.

Non-Prestonian behavior can be induced by using copper CMP slurries utilizing the following polymers:

Homopolymers: polyacrylic acid and polymethacrylic acid (U.S. Pat. No. 6,117,775);

Heteropolymers: polyacrylate-polymethacrylate copolymers (U.S. Pat. No. 6,632,259, U.S. Pat. Pub. Nos. 2006/0000150 and 2006/0000151);

Polymer mixtures: polyacrylic acid and polyvinylpyrrolidone (U.S. Pat. Pub. Nos. 2007/0176141 and 2006/0138086), polyacrylic acid and polysulfonic acid (U.S. Pat. Pub. No. 2006/0191872);

Blends with polymers: zwitterions and polyacrylic acid (U.S. Pat. Pub. Nos. 2005/0189322 and 2007/0007248), quaternary ammonium ions and polyacrylic acid (U.S. Pat. Pub. No. 2006/0205219), benzotriazole (BTA) and homopolymers (U.S. Pat. Nos. 6,899,821 and 6,896,825 and U.S. Pat. Pub. No. 2005/0095860), BTA and polyacrylic acid (U.S. Pat. No. 6,461,230).

However, the conventional polishing systems are not satisfactory in effectively exhibiting a non-Prestonian behavior.

SUMMARY OF THE INVENTION

In accordance with one aspect of the present invention, there is provided a slurry precursor composition for chemical mechanical polishing (CMP) of a metal, comprising a liquid carrier, an abrasive, a complexing agent, a corrosion inhibitor and a copolymer, wherein the copolymer has an average molecular weight of about 600,000 to about 1,300,000 and includes acrylic acid and acrylamide monomers in a copolymerization ratio of about 1:30 to about 30:1.

The average molecular weight of the copolymer can be determined by gel permeation chromatography (GPC) using pullulan as a molecular weight standard and an aqueous mobile phase.

The copolymer can be present in an amount of about 0.001 to about 1% by weight, based on the weight of the liquid carrier and any other components dissolved or suspended therein (i.e. the total weight of a final slurry composition, including the slurry precursor and oxidizing agent).

The abrasive can be alumina or silica.

The abrasive can be present in an amount of about 0.1 to about 20% by weight, based on the weight of the liquid carrier and any other components dissolved or suspended therein.

The complexing agent can be selected from the group consisting of carbonyl compounds, carboxylic acids and their salts, alcohols, amine-containing compounds, and combinations thereof.

The complexing agent can be present in an amount of about 0.01 to about 5% by weight, based on the weight of the liquid carrier and any other components dissolved or suspended therein.

The corrosion inhibitor can be selected from the group consisting of ammonia, alkylamines, amino acids, imines, azoles, and combinations thereof.

The corrosion inhibitor can include benzotriazole and its derivatives.

The corrosion inhibitor can be an isomeric mixture of 2,2'-[[(5-methyl-1H-benzotriazole-1-yl)-methyl]imino]bis-ethanol and 2,2'-[[(4-methyl-1H-benzotriazole-1-yl)-methyl]imino]bis-ethanol.

The corrosion inhibitor can be present in an amount of about 0.005 to about 5% by weight, based on the weight of the liquid carrier and any other components dissolved or suspended therein.

The slurry precursor composition of the present invention may further comprise a pH-adjusting agent.

The pH-adjusting agent can be selected from the group consisting of sodium hydroxide, potassium hydroxide, ammonium hydroxide, sodium carbonate, potassium carbonate, sulfuric acid, hydrochloric acid, nitric acid, phosphoric acid, citric acid, potassium phosphate, and combinations thereof.

The slurry precursor composition of the present invention may further comprise a surfactant.

The surfactant can be an amphoteric or non-ionic surfactant.

The surfactant can be present in an amount of about 0.01 to about 5% by weight, based on the weight of the liquid carrier and any other components dissolved or suspended therein.

The CMP slurry precursor composition of the present invention may further comprise a biocide or an antifoaming agent.

The biocide or the antifoaming agent can be isothiazolinone or polydimethylsiloxane.

The biocide can be present in an amount of about 1 to about 50 ppm and the antifoaming agent can be present in an amount of about 40 to about 140 ppm, based on the weight of the liquid carrier and any other components dissolved or suspended therein.

The liquid carrier can include deionized water.

In accordance with another aspect of the present invention, there is provided a CMP slurry composition comprising the CMP slurry precursor composition and an oxidizing agent, which are mixed together before polishing. The CMP slurry composition of the invention can exhibit a non-Prestonian behavior to achieve minimized dishing and attain a high degree of planarization.

The oxidizing agent can be selected from the group consisting of inorganic and organic per-compounds, hydrobromic acid and its salts, nitric acid and its salts, hydrochloric acid and its salts, chromic acid and its salts, hydroiodic acid and its salts, iron and copper salts, rare earth and transition metal oxides, potassium ferricyanide, potassium dichromate, and combinations thereof.

The oxidizing agent can be present in an amount of about 0.1 to about 30% by weight, based on the weight of the liquid carrier and any other components dissolved or suspended therein.

In accordance with yet another aspect of the present invention, there is provided a polishing method using the metal CMP slurry composition.

BRIEF DESCRIPTION OF THE DRAWINGS

FIG. 1 is a graph showing variations in the polishing removal rate of copper according to polishing down force that illustrates Prestonian and non-Prestonian behaviors.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The slurry precursor composition of the present invention for chemical mechanical polishing of a metal includes a liquid carrier, an abrasive, a complexing agent, a corrosion inhibitor and a copolymer, wherein the copolymer has an average molecular weight of about 600,000 to about 1,300,000 and includes acrylic acid and acrylamide monomers in a copolymerization ratio of about 1:30 to about 30:1.

Copolymer

The term "copolymer" as used herein refers to a polymer of two or more different monomers. The copolymerization ratio between monomers is varied to allow the composition to exhibit a unique polishing behavior unlike homopolymers of each of the monomers.

Acrylic acid and acrylamide monomers are used in a molar ratio of about 1:30 to about 30:1, for example about 5:95 to about 95:5 and as another example about 10:90 to about 80:20 to synthesize the copolymer. The copolymer has an average molecular weight ranging from about 600,000 to about 1,300,000, for example from about 610,000 to about 1,000,000, and as another example from about 630,000 to about 950,000, as determined by gel permeation chromatography (GPC) using pullulan as a molecular weight standard and an aqueous mobile phase. The amount of the copolymer used for an effective non-Prestonian behavior can range from about 0.001 to about 1% by weight, for example from about 0.005 to about 0.5% by weight, and as another example about 0.01 to about 0.1% by weight, based on the weight of the liquid carrier and any other components dissolved or suspended therein.

Abrasive

Any suitable known abrasive may be used in the present invention. For example, the abrasive may be a natural or synthetic one. Suitable abrasives for use in the present invention can include without limitation diamond (e.g., polycrystalline diamond), garnet, glass, carborundum, metal oxides, metal carbides, metal nitrides, and combinations thereof. Suitable metal oxides can include without limitation alumina, silica, titania, ceria, zirconia, germania, magnesia, coformed products thereof, and combinations thereof. The abrasive can have an average particle size (diameter) of about 10 nm to about 500 nm, for example about 40 nm to about 300 nm (e.g., about 100 nm to about 200 nm).

Typically, the amount of the abrasive used can be from about 0.1 to about 20% by weight, for example about 0.2 to about 10% by weight and as another example about 0.5 to about 5% by weight, based on the weight of the liquid carrier and any other components dissolved or suspended therein.

Oxidizing Agent

The chemical oxidizing agent may be any known oxidizing agent suitable for use in CMP processes. Suitable oxidizing agents for use in the present invention can include without limitation inorganic and organic per-compounds, hydrobromic acid and its salts, nitric acid and its salts, hydrochloric acid and its salts, chromic acid and its salts, hydroiodic acid and its salts, iron and copper salts (e.g., nitrates, sulfates, EDTA salts, and citrates), rare earth and transition metal oxides (e.g., osmium tetroxide), potassium ferricyanide, potassium dichromate, and the like, and combinations thereof. As defined by Hawley's Condensed Chemical Dictionary, the term 'per-compound' as used herein refers to a compound containing one or more peroxy groups (—O—O—) or a compound containing an element in its highest oxidation state. Examples of the compound containing one or more peroxy groups (—O—O—) include, but are not limited to, hydrogen peroxide, hydrogen peroxide adducts (e.g., urea hydrogen peroxide and percarbonate), organic peroxides (e.g., benzoyl peroxide, peracetic acid and di-t-butyl peroxide), monopersulfuric acid and its salts ($SO_5^{2-}$), dipersulfuric acid and its salts ($S_2O_8^{2-}$), and sodium peroxide. Examples of the compound containing an element in its highest oxidation state include, but are not limited to, periodic acid and its salts, perbromic acid and its salts, perchloric acid and its salts, perboric acid and its salts, and permanganic acid and its salts. The CMP system (particularly, the polishing composition) typically comprises about 0.1 to about 30% by weight, for example about 0.2 to about 20% by weight, and as another example about 0.5 to about 15% by weight, and as yet another example about 1 to about 10% by weight of the oxidizing agent, based on the weight of the liquid carrier and any other components dissolved or suspended therein.

The oxidizing agent can be mixed with the CMP slurry precursor composition just before polishing.

Complexing Agent

The polishing composition comprises a complexing agent (or a chelating agent). Any chemical additive that increases the removal rate of a metal on a substrate can be used as the complexing agent. Examples of suitable complexing agents (chelating agents) for use in the present invention can include without limitation carbonyl compounds (e.g., acetylacetonate), simple carboxylic acids and their salts (e.g., acetic acid and its salts and arylcarboxylic acids and their salts), carboxylic acids having one or more hydroxyl groups and their salts (e.g., glycolic acid and its salts, lactic acid and its salts, gluconic acid and its salts, and gallic acid and its salts), di-, tri- and polycarboxylic acids and their salts (e.g., oxalic acid and its salts, phthalic acid and its salts, citric acid and its salts, succinic acid and its salts, tartaric acid and its salts, malic acid and its salts, EDTA and its salts (e.g., di-potassium EDTA), and combinations thereof), and carboxylic acids having one or more sulfonic acid and/or phosphonic acid groups and their salts, and combinations thereof. Examples of other suitable complexing agents (chelating agents) include di-, tri- and polyalcohols (e.g., ethylene glycol, pyrocatechol, pyrogallol and tannic acid), and amine-containing compounds (e.g., ammonia, amino acids, amino alcohols, and di-, tri- and polyamines), and combinations thereof. The kind of the complexing agent (chelating agent) can be determined according to the type of the metal to be removed.

The above-mentioned compounds may be present in the form of salts (e.g., metal salts and ammonium salts), acids or partial salts. For example, citric acid and its salts include citric acid and mono-, di- and tri-citrates. Phthalic acid and its salts include phthalic acid, monophthalates (e.g., potassium hydrogen phthalate) and diphthalates. Perchloric acid and its salts include the corresponding acid (i.e. perchloric acid) and perchlorates. Some of the compounds or reactants can perform one or more functions. For example, a certain compound (e.g., iron nitrate) can act as a chelating agent and an oxidizing agent.

The amount of the complexing agent used can range from about 0.01 to about 5% by weight, for example from about 0.05 to about 2% by weight and as another example about 0.1 to about 1% by weight, based on the weight of the liquid carrier and any other components dissolved or suspended therein.

Corrosion Inhibitor

The corrosion inhibitor used in the present invention is a material that retards the chemical reactions of the oxidizing agent. The corrosion inhibitor functions as a polishing control agent that suppresses corrosion of low-topography regions where no mechanical polishing occurs. High-topography regions are removed by the mechanical actions of the abrasive. A nitrogenous compound is exclusively used as the corrosion inhibitor. Examples of suitable corrosion inhibitors for use in the present invention include ammonia, alkylamines, amino acids, imines, and azoles. These corrosion inhibitors may be used alone or in combination as a mixture of two or more of the agents. Cyclic nitrogen compounds and derivatives thereof, including benzotriazole and its derivatives, can be useful. An isomeric mixture of 2,2'-[[(5-methyl-1H-benzotriazole-1-yl)-methyl]imino]bis-ethanol and 2,2'-[[(4-methyl-1H-benzotriazole-1-yl)-methyl]imino]bis-ethanol can also be used.

The amount of the corrosion inhibitor used is determined taking into consideration the corrosion inhibitory effects, the optimal polishing rate and the prevention of deterioration in the stability of the slurry, and can range from about 0.005 to about 5% by weight, for example from about 0.05 to about 1% by weight and as another example from about 0.1 to about 0.5% by weight, based on the weight of the liquid carrier and any other components dissolved or suspended therein.

pH-Adjusting Agent

The polishing composition of the present invention may optionally further comprise at least one pH-adjusting agent, pH-control agent or pH-buffering agent to assist in maintaining the pH of the composition at a desired level. Examples of suitable pH-adjusting agents, pH-control agents and pH-buffering agents for use in the present invention can include without limitation sodium hydroxide, potassium hydroxide, ammonium hydroxide, sodium carbonate, potassium carbonate, sulfuric acid, hydrochloric acid, nitric acid, phosphoric acid, citric acid, potassium phosphate, and combinations thereof.

Surfactant

The polishing composition may optionally further comprise a surfactant to achieve a high polishing selectivity and/or a high degree of planarization. As the surfactant, there may be suitably used, for example, a cationic surfactant, an anionic surfactant (e.g., polyacrylate), an amphoteric surfactant, a non-ionic surfactant or a combination thereof. Examples of suitable amphoteric surfactants for use in the present invention can include without limitation ammonium carboxylate, ammonium sulfate, amine oxide, N-dodecyl-N,N-dimethyl betaine, betaine, sulfobetaine, and alkyl ammoniopropyl sulfate, and combinations thereof. Examples of suitable non-ionic surfactants for use in the present invention can include without limitation 2,4,7,9-tetramethyl-5-decyne-4,7-diol ethoxylate and acetylenic glycol surfactants, such as polyoxyethylene $C_{6-30}$ alkyl ethers, polyoxyethylene $C_{6-30}$ alkyl acid esters, polyoxyethylene $C_{6-30}$ alkyl phenyl ethers, polyoxyethylene $C_{6-30}$ alkyl cyclohexyl ethers, sorbitan $C_{6-30}$ alkyl acid esters, polyoxyethylene sorbitan $C_{6-30}$ alkyl acid esters and ethylenediamine polyoxyethylene, and combinations thereof. The amount of the surfactant used is typically from about 0.01 to about 5% by weight, based on the weight of the liquid carrier and any other components dissolved or suspended therein.

Biocide/Antifoaming Agent

The polishing composition may optionally further comprise a biocide and/or an antifoaming agent. The biocide may be any known suitable one, e.g., an isothiazolinone biocide. The content of the biocide in the polishing composition is typically from about 1 to about 50 ppm, for example about 10 to about 20 ppm, based on the weight of the liquid carrier and any other components dissolved or suspended therein. The antifoaming agent may be any known suitable one, e.g., polydimethylsiloxane. The amount of the antifoaming agent is typically from about 40 to about 140 ppm, based on the weight of the liquid carrier and any other components dissolved or suspended therein.

Liquid Carrier

The liquid carrier is used to efficiently apply the abrasive, the polishing additives and any other components dissolved or suspended therein to the surface of a substrate to be polished (planarized). The liquid carrier is typically an aqueous solution. The liquid carrier may be water alone, a solution of water in a suitable water-miscible solvent, or an emulsion. Suitable water-miscible solvents can include without limitation alcohols, such as methanol and ethanol, and combinations thereof. In a certain embodiment, the liquid carrier includes a supercritical liquid. The liquid carrier can be water, for example deionized water. The liquid carrier optionally further includes a solvent or a surfactant capable of assisting in the dissolution of the polishing additives to increase the amounts of the polishing additives on the surface of a substrate to be polished.

The CMP composition of the present invention is brought into contact with the surface of a semiconductor wafer to polish the semiconductor wafer.

Hereinafter, the present invention will be explained in more detail with reference to the following examples. However, these examples are given for the purpose of illustration only and are not to be construed as limiting the scope of the invention.

EXAMPLES

Examples 1 to 4 (Influence of Average Molecular Weight of Polymer on Non-Prestonian Behavior)

All polymers are purchased from Susan Industries, Korea and Guymong Industries, Korea. The polymers are prepared from 10% of polyacrylic acid (PAA) and 90% of polyacrylamide (PAM). The average molecular weights of the polymers are determined by gel permeation chromatography (GPC) using pullulan polysaccharide as a molecular weight standard and an aqueous mobile phase under the following detailed conditions.

GPC: Waters 600 Pump/Controller
Standard: Pullulan (Shodex P-82)
Column: Waters Ultrahydrogel 250
Detector: Waters 2414
Mobile Phase: 0.4% $NaNO_3$
Flow Rate: 1.0 ml/min.

Each polishing composition is prepared by the following procedure. First, colloidal silica (ST-O, Nissan) is suspended in a liquid carrier until the concentration reaches 1% by weight with respect to the weight of the final composition. Then, each of the polymers having the average molecular weights indicated in Table 1 is added to a standard copper slurry containing 0.5% of malic acid (Samchun) and 0.5% of Irgamet-42 (Ciba) until the concentration of the polymer reaches 0.05% by weight with respect to the final composition to prepare a polishing composition. The pH of the compositions is adjusted to 2.1 with nitric acid. 30% hydrogen peroxide is added to the compositions until the contents of the hydrogen peroxide in the final polishing slurries reaches 3% by weight. Immediately after the addition, the polishing slurries are used to polish copper wafers.

The copper wafers are purchased from SVMI (California, U.S.A.). The wafers are polished using a MIRRA tool (manufactured by Applied Materials) under the following high-pressure and low-pressure setting conditions:

High-pressure setting conditions
Down Force: 3 psi,
Retainer Ring Pressure: 4 psi,
Platen Speed: 93 rpm,
Head Speed: 87 rpm,
Polishing Time: 60 sec.
Low-pressure setting conditions
Down Force: 1.5 psi,
Retainer Ring Pressure: 3 psi,
Platen Speed: 93 rpm,
Head Speed: 87 rpm,
Polishing Time: 60 sec.

Comparative Examples 1 to 3

Compositions are prepared in the same manner as in Examples 1 to 4 except that the respective polymers indicated in Table 1 are used. The compositions are used to polish copper wafers.

The effect of average molecular weights of the copolymers of polyacrylic acid (PAA, 10%)/polyacrylamide (PAM, 90%) on copper removal rates is evaluated at down forces of 3 psi and 1.5 psi. The results are shown in Table 1.

TABLE 1

|  | Polymer code | $M_w$ | RR (3) | RR (1.5) | RR (3)/ RR (1.5) |
|---|---|---|---|---|---|
| Comparative Example 1 | P (250K) | 246,970 | 8,549 | 4,002 | 2.1 |
| Comparative Example 2 | P (594K) | 594,598 | 7,438 | 3,962 | 1.9 |
| Example 1 | P (632K) | 632,111 | 5,988 | 1,783 | 3.4 |
| Example 2 | P (732K) | 732,204 | 8,200 | 1,390 | 5.9 |
| Example 3 | P (846K) | 846,772 | 6,282 | 1,905 | 3.3 |
| Example 4 | P (945K) | 945,281 | 6,127 | 1,603 | 3.8 |
| Comparative Example 3 | P (1,304K) | 1,304,652 | 6,063 | 3,189 | 1.9 |

* Note
RR (3): Copper removal rate (CuRR) on a copper blanket wafer at a down force of 3 psi
RR (1.5): Copper removal rate (CuRR) on a copper blanket wafer at a down force of 1.5 psi
RR (3)/RR (1.5): Value obtained by dividing the CuRR at 3 psi by the CuRR at 1.5 psi.

According to the Prestonian equation, the ratio RR (3)/RR (1.5) must be 2.0 at a constant polishing rate. If the ratio RR (3)/RR (1.5) of a composition significantly differs from 2.0 in a region, the composition exhibits a non-Prestonian behavior in the region rather than a Prestonian relationship. The results of Table 1 reveal that when the polymers whose average molecular weights are outside the range of 600,000 to 1,300,000 are used, the ratio RR (3)/RR (1.5) approximates 2.0, which is consistent with a mechanism in a Prestonian form. In contrast, the copper removal rates of the compositions using the polymers whose average molecular weight is in the range of 600,000 to 1,300,000 at a polishing pressure of 1.5 psi decreases more rapidly than those estimated by the Prestonian equation. Therefore, a non-Prestonian behavior is exhibited when the polymers having an average molecular weight of about 600,000 to about 1,300,000 are used.

Examples 5 to 7 (Influence of Copolymerization Ratios of Monomers on Non-Prestonian Behavior)

All polymers are purchased from Polyscience (Pennsylvania, U.S.A.) and Sigma-Aldrich (Korea). The polymers are found to have an average molecular weight of 750,000, as determined by the same method as described in Examples 1 to 4. 0.05% by weight of each of the polymers having copolymerization ratios indicated in Table 2 is added to a standard copper slurry, which is the same kind as used in Examples 1 to 4, to prepare a slurry composition. The pH of the compositions is adjusted to 2.1 with nitric acid. 30% hydrogen peroxide is added to the compositions until the content of the hydrogen peroxide in the final polishing slurries reaches 3% by weight. Immediately after the addition, polishing is conducted using the same kinds of copper wafers and polishing equipment as those used in Examples 1 to 4. The copper wafers are polished by the same procedure as described in Examples 1 to 4 except that the polishing down force under the low-pressure setting conditions is set to 1.0 psi.

Comparative Examples 4 and 5

Compositions are prepared in the same manner as in Examples 5 to 7 except that the copolymers having the copolymerization ratios indicated in Table 2 are used. Copper wafers are polished by the same procedure as described in Examples 5 to 7.

The effect of the copolymerization ratio of the copolymers of polyacrylic acid (PAA)/polyacrylamide (PAM) on the copper removal rates is evaluated at down forces of 3 psi and 1 psi. The results are shown in Table 2.

TABLE 2

| | Copolymerization ratio (PAM:PAA) | CuRR (3 psi) | CuRR (1 psi) | CuRR (3 psi)/ CuRR (1 psi) |
|---|---|---|---|---|
| Comparative Example 4 | 100:0 | 9,195 | 5,019 | 1.8 |
| Example 5 | 90:10 | 9,320 | 644 | 14.5 |
| Example 6 | 80:20 | 8,918 | 815 | 10.9 |
| Example 7 | 20:80 | 8,568 | 2,056 | 4.2 |
| Comparative Example 5 | 0:100 | 11,594 | 3,367 | 3.4 |

*Note
RR (3): Copper removal rate (CuRR) on a copper blanket wafer at a down force of 3 psi
RR (1.5): Copper removal rate (CuRR) on a copper blanket wafer at a down force of 1 psi
RR (3)/RR (1): Value obtained by dividing the CuRR at 3 psi by the CuRR at 1 psi.

According to the normal Prestonian behavior, when the polishing down force decreases by a factor of 3, the copper removal rate is expected to decrease by the same factor. This phenomenon is observed only when the homopolymer of polyacrylic acid (Comparative Example 5) is used.

When the copolymerization ratio between monomers is varied, two forms of a non-Prestonian behavior, i.e. a hyposensitive non-Prestonian behavior and a hypersensitive non-Prestonian behavior, are exhibited.

The hyposensitive non-Prestonian behavior means a phenomenon wherein when the polishing down force decreases by a factor of 3, the copper removal rate decreases by a factor of less than 3. The hyposensitive non-Prestonian behavior is exhibited when a polishing composition whose main function is etching is used. As the mechanical effects of the down force disappear, the primary removal mechanism is chemical etching. This phenomenon is observed when the homopolymer of polyacrylamide (PAM) is used (Comparative Example 4). The corrosion inhibitory effects of the corrosion inhibitor (Irgamet) impair the functions of the polyacrylamide polymer, and as a result, chemical etching becomes important. The hyposensitive non-Prestonian behavior is undesirable for CMP because the removal rate is maintained at a high level even at a low down force.

The hypersensitive non-Prestonian behavior occurs when the polishing down force decreases by a factor of 3, the copper removal rate decrease by a factor of more than 3. Such behavior is observed when a polymer weakly interacting with a surface to be polished. Little or no interaction between the polymer and the surface is present at a high down force, which is clear from the observation that the copper removal rate (CuRR) is not decreased at 3 psi although the compositions of the copolymers are varied. In contrast, the polymer modifies the surface and the CuRR is decreased at a low down force. The ratio (RR (3)/RR (1)) of the removal rates is changed from 4.2 (Example 7), which substantially corresponds to a Prestonian behavior, to above 14 (Example 5), where the removal rate is extremely decreased due to the high polyamide content, with varying compositions of the copolymers. Through the minute control of the removal rates, the slurries can be designed so as to more sensitively respond with respect to low down force polishing coefficients. The slurries exhibiting the behavior can provide high planarization efficiency, low pattern dependency and wider over-polishing window.

However, the CuRR of the slurry composition using the homopolymer of polyacrylic acid at 1 psi is not satisfactorily inhibited. This demonstrates that the desired behavior is exhibited by the copolymer of polyacrylic acid and polyacrylamide rather than polyacrylic acid.

With the CMP composition and the CMP method of the present invention, when a semiconductor wafer is exposed to the CMP composition, excessive dishing of metal interconnects is prevented, metal is adequately removed, and good metal removal rate is provided. Specifically, optimal polishing results can be attained by varying the ratio of monomers constituting the copolymer used in the composition of the present invention. The polishing composition of the present invention is particularly useful for the polishing of copper interconnects. The polishing composition of the present invention also provides enhanced polishing of other nonferrous metals, such as aluminum, tungsten, platinum and alloys thereof.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A slurry precursor composition for chemical mechanical polishing (CMP) of a metal, comprising: a liquid carrier, an abrasive consisting of an inorganic abrasive, a complexing agent, a corrosion inhibitor and a copolymer, wherein the copolymer has an average molecular weight of about 630,000 to about 950,000 and includes acrylic acid and acrylamide monomers in a copolymerization ratio of about 10:90 to about 80:20, wherein the composition exhibits non-Prestonian behavior, and wherein the composition provides a ratio of copper removal rate at 3 psi to copper removal rate at 1 psi (CuRR (3)/CuRR (1)) of 4.2 to 14.5.

2. The slurry precursor composition according to claim 1, wherein the average molecular weight of the copolymer is determined by gel permeation chromatography (GPC) using pullulan as a molecular weight standard and an aqueous mobile phase.

3. The slurry precursor composition according to claim 1, wherein the copolymer is present in an amount of about 0.001 to about 1% by weight, based on the weight of the liquid carrier and any other components dissolved or suspended therein.

4. The slurry precursor composition according to claim 1, wherein the abrasive consists of alumina or silica.

5. The slurry precursor composition according to claim 1, wherein the abrasive is present in an amount of about 0.1 to about 20% by weight, based on the weight of the liquid carrier and any other components dissolved or suspended therein.

6. The slurry precursor composition according to claim 1, wherein the complexing agent is selected from the group consisting of carbonyl compounds, carboxylic acids and salts thereof, alcohols, amine-containing compounds, and combinations thereof.

7. The slurry precursor composition according to claim 1, wherein the complexing agent is present in an amount of about 0.01 to about 5% by weight, based on the weight of the liquid carrier and any other components dissolved or suspended therein.

8. The slurry precursor composition according to claim 1, wherein the corrosion inhibitor is selected from the group consisting of ammonia, alkylamines, amino acids, imines, azoles, and combinations thereof.

9. The slurry precursor composition according to claim 1, wherein the corrosion inhibitor comprises benzotriazole and derivatives thereof.

10. The slurry precursor composition according to claim 1, wherein the corrosion inhibitor is an isomeric mixture of 2,2'-[[(5-methyl-1H-benzotriazole-1-yl)-methyl]imino]bis-ethanol and 2,2'-[[(4-methyl-1H-benzotriazole-1-yl)-methyl]imino]bis-ethanol.

11. The slurry precursor composition according to claim 1, wherein the corrosion inhibitor is present in an amount of about 0.005 to about 5% by weight, based on the weight of the liquid carrier and any other components dissolved or suspended therein.

12. The slurry precursor composition according to claim 1, further comprising a pH-adjusting agent.

13. The slurry precursor composition according to claim 12, wherein the pH-adjusting agent is selected from the group consisting of sodium hydroxide, potassium hydroxide, ammonium hydroxide, sodium carbonate, potassium carbonate, sulfuric acid, hydrochloric acid, nitric acid, phosphoric acid, citric acid, potassium phosphate, and combinations thereof.

14. The slurry precursor composition according to claim 1, further comprising a surfactant.

15. The slurry precursor composition according to claim 14, wherein the surfactant is an amphoteric or non-ionic surfactant.

16. The slurry precursor composition according to claim 14, wherein the surfactant is present in an amount of about 0.01 to about 5% by weight, based on the weight of the liquid carrier and any other components dissolved or suspended therein.

17. The slurry precursor composition according to claim 1, further comprising a biocide, or an antifoaming agent, or both a biocide and an antifoaming agent.

18. The slurry precursor composition according to claim 17, wherein the biocide is isothiazolinone and the antifoaming agent is polydimethylsiloxane.

19. The slurry precursor composition according to claim 17, wherein the biocide is present in an amount of about 1 to about 50 ppm and the antifoaming agent is present in an amount of about 40 to about 140 ppm, based on the weight of the liquid carrier and any other components dissolved or suspended therein.

20. The slurry precursor composition according to claim 1, wherein the liquid carrier comprises deionized water.

21. The slurry precursor composition according to claim 1, wherein the abrasive consists of a metal oxide abrasive and has an average particle diameter of about 40 to about 300 nm.

22. The slurry precursor composition according to claim 1, wherein the copolymer includes acrylic acid and acrylamide monomers in a copolymerization ratio of about 10:90 to about 20:80.

23. The slurry precursor composition according to claim 1, wherein the copolymer includes acrylic acid and acrylamide monomers in a copolymerization ratio of about 10:90.

24. The slurry precursor composition according to claim 1, wherein the copolymer consists of a copolymer of acrylic acid and acrylamide monomers in a copolymerization ratio of about 10:90 to about 80:20 and having an average molecular weight of about 630,000 to about 950,000.

25. The slurry precursor composition according to claim 1, wherein the copolymer includes acrylic acid and acrylamide monomers in a copolymerization ratio of about 10:90 to about 20:80 and wherein the composition provides a ratio of copper removal rate at 3 psi to copper removal rate at 1 psi (CuRR (3)/CuRR (1)) of 10.9 to 14.5.

26. The slurry precursor composition according to claim 1, wherein the composition exhibits hypersensitive non-Prestonian behavior.

27. A chemical mechanical polishing (CMP) slurry composition comprising a CMP slurry precursor composition comprising a liquid carrier, an abrasive consisting of an inorganic abrasive, a complexing agent, a corrosion inhibitor and a copolymer, wherein the copolymer has an average molecular weight of about 630,000 to about 950,000 and includes acrylic acid and acrylamide monomers in a copolymerization ratio of about 10:90 to about 80:20 and an oxidizing agent, wherein said CMP slurry composition exhibits non-Prestonian behavior, and wherein said CMP slurry composition exhibits a ratio of copper removal rate at 3 psi to copper removal rate at 1 psi (CuRR (3)/CuRR (1)) of 4.2 to 14.5.

28. The slurry composition according to claim 27, wherein the oxidizing agent is mixed with the slurry precursor composition before polishing.

29. The slurry composition according to claim 27, wherein the oxidizing agent is selected from the group consisting of inorganic and organic per-compounds, hydrobromic acid and salts thereof, nitric acid and salts thereof, hydrochloric acid and salts thereof, chromic acid and salts thereof, hydroiodic acid and salts thereof, iron and copper salts, rare earth and transition metal oxides, potassium ferricyanide, potassium dichromate, and combinations thereof.

30. The slurry composition according to claim 27, wherein the oxidizing agent is present in an amount of about 0.1 to about 30% by weight, based on the weight of the liquid carrier and any other components dissolved or suspended therein.

31. A chemical mechanical polishing (CMP) slurry composition comprising:
a first component comprising a CMP slurry precursor composition comprising a liquid carrier, an abrasive consisting of an inorganic abrasive, a complexing agent, a corrosion inhibitor and a copolymer, wherein the copolymer has an average molecular weight of about 630,000 to about 950,000 and includes acrylic acid and acrylamide monomers in a copolymerization ratio of about 10:90 to about 80:20 and
a second component comprising an oxidizing agent,
wherein said CMP slurry composition exhibits non-Prestonian behavior, and
wherein said CMP slurry composition exhibits a ratio of copper removal rate at 3 psi to copper removal rate at 1 psi (CuRR (3)/CuRR (1)) of 4.2 to 14.5.

32. A chemical mechanical polishing (CMP) slurry composition comprising a liquid carrier, an abrasive consisting of an inorganic abrasive, a complexing agent, a corrosion inhibitor, a copolymer, wherein the copolymer has an average molecular weight of about 630,000 to about 950,000 and includes acrylic acid and acrylamide monomers in a copolymerization ratio of about 10:90 to about 80:20, and an oxidizing agent,
wherein said CMP slurry composition exhibits non-Prestonian behavior, and
wherein said CMP slurry composition exhibits a ratio of copper removal rate at 3 psi to copper removal rate at 1 psi (CuRR (3)/CuRR (1)) of 4.2 to 14.5.

33. The chemical mechanical polishing (CMP) slurry composition according to claim 32, wherein the abrasive consists of a metal oxide abrasive and has an average particle diameter of about 40 to about 300 nm.

34. The chemical mechanical polishing (CMP) slurry composition according to claim 32, wherein the copolymer includes acrylic acid and acrylamide monomers in a copolymerization ratio of about 10:90 to about 20:80.

35. The chemical mechanical polishing (CMP) slurry composition according to claim 32, wherein the copolymer includes acrylic acid and acrylamide monomers in a copolymerization ratio of about 10:90.

36. The chemical mechanical polishing (CMP) slurry composition according to claim 32, wherein the copolymer consists of a copolymer of acrylic acid and acrylamide monomers in a copolymerization ratio of about 10:90 to about 80:20 having an average molecular weight of about 630,000 to about 950,000.

37. The chemical mechanical polishing (CMP) slurry composition according to claim 32, wherein the copolymer includes acrylic acid and acrylamide monomers in a copolymerization ratio of about 10:90 to about 20:80 and wherein the composition provides a ratio of copper removal rate at 3 psi to copper removal rate at 1 psi (CuRR (3)/CuRR (1)) of 10.9 to 14.5.

38. A method for polishing a substrate including at least one metal layer, comprising:
applying a chemical mechanical polishing (CMP) slurry composition comprising a liquid carrier, an abrasive consisting of an inorganic abrasive, a complexing agent, a corrosion inhibitor, a copolymer, wherein the copolymer has an average molecular weight of about 630,000 to about 950,000 and includes acrylic acid and acrylamide monomers in a copolymerization ratio of about 10:90 to about 80:20, and an oxidizing agent to the substrate to be polished under conditions suitable for chemical mechanical polishing of said metal layer,
wherein said CMP slurry composition exhibits non-Prestonian behavior, and
wherein said CMP slurry composition exhibits a ratio of copper removal rate at 3 psi to copper removal rate at 1 psi (CuRR (3)/CuRR (1)) of 4.2 to 14.5.

39. The method according to claim 38, further comprising preparing said CMP slurry composition prior to said applying step.

40. The method according to claim 39, wherein said preparing step comprises mixing said liquid carrier, abrasive, complexing agent, corrosion inhibitor, copolymer, and oxidizing agent to form said CMP slurry composition.

41. The method according to claim 39, wherein said preparing step comprises:
mixing said liquid carrier, abrasive, complexing agent, corrosion inhibitor, and copolymer to form a CMP slurry precursor composition; and
thereafter mixing said oxidizing agent with the slurry precursor composition.

42. The method according to claim 38, wherein said metal layer comprises copper.

43. A slurry precursor composition for chemical mechanical polishing (CMP) of a metal, consisting essentially of: a liquid carrier, an abrasive consisting of an inorganic abrasive, a complexing agent, a corrosion inhibitor, a copolymer, wherein the copolymer has an average molecular weight of about 630,000 to about 950,000 and includes acrylic acid and acrylamide monomers in a copolymerization ratio of about 10:90 to about 80:20,
wherein the composition exhibits non-Prestonian behavior, and
wherein the composition provides a ratio of copper removal rate at 3 psi to copper removal rate at 1 psi (CuRR (3)/CuRR (1)) of 4.2 to 14.5.

44. The slurry precursor composition according to claim 43, wherein the copolymer is a copolymer of acrylic acid and acrylamide monomers in a copolymerization ratio of 10:90 to 20:80.

45. The slurry precursor composition according to claim 44, wherein the composition provides a ratio of copper removal rate at 3 psi to copper removal rate at 1 psi (CuRR (3)/CuRR (1)) of 10.9 to 14.5.

* * * * *